United States Patent
Yoshikawa et al.

(10) Patent No.: US 7,587,815 B2
(45) Date of Patent: Sep. 15, 2009

(54) RESIN-COATED METAL PLATE AND METHOD OF DRILLING PRINTED WIRING BOARD USING THE METAL PLATE

(75) Inventors: Eiichiro Yoshikawa, Kobe (JP); Akitoshi Fujisawa, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 0 days.

(21) Appl. No.: 11/878,551

(22) Filed: Jul. 25, 2007

(65) Prior Publication Data

US 2008/0058230 A1  Mar. 6, 2008

(30) Foreign Application Priority Data

Aug. 29, 2006 (JP) .............................. 2006-232474

(51) Int. Cl.
*B23B 51/06* (2006.01)
*B41L 13/00* (2006.01)

(52) U.S. Cl. ............................. 29/830; 29/829; 29/847; 29/852; 29/729; 174/250; 508/100

(58) Field of Classification Search .................. 29/729, 29/847, 852, 830, 829, 728; 174/250; 508/100
See application file for complete search history.

(56) References Cited

U.S. PATENT DOCUMENTS 4,781,495 A  11/1988  Hatch et al.
4,929,370 A  5/1990  Hatch et al.
6,753,300 B2  6/2004  Eziri et al.
2005/0145123 A1*  7/2005  Yoshikawa et al. ..... 101/128.21

FOREIGN PATENT DOCUMENTS

| JP | 2000-218599 | 1/1999 |
| JP | 2001-150215 | 11/1999 |
| JP | 2001-246696 | 3/2000 |
| JP | 2004-237546 | 2/2003 |
| KR | 10-2005-0056149 | 12/2004 |

OTHER PUBLICATIONS

JIS—Japanese Industrial Standards, Testing method for softening temperature of Thermoplastics film and sheeting by Thermomechanical analysis. Japanese Standards Association, JIS K 7196-1991.*
JIS—Japanese Industrial Standards, Testing Methods for Transition Temperatures. Japanese Standards Association, JIS K 7121-1987.*
Republic of Korea's Office Action dated Sep. 3, 2008 regarding Republic of Korea's Patent Application No. 10-2007-86334.

* cited by examiner

*Primary Examiner*—Derris H Banks
*Assistant Examiner*—Dan D Le
(74) *Attorney, Agent, or Firm*—Stites & Harbison, PLLC; Juan Carlos A. Marquez, Esq.

(57) ABSTRACT

A resin-coated metal plate used as a protective plate in drilling a printed wiring board has a metal plate and a resin film including a thermoplastic resin coated on at least one surface of the metal plate. A melting peak temperature of the thermoplastic resin is in a range of 60-120° C., and in a TMA curve, a temperature difference exhibited by the thermoplastic resin is within a range of 5° C. to 30° C. in a period while penetration of the probe is changed from 10% to 100% of the resin thickness in a temperature range of 20° C. to 200° C.

7 Claims, 1 Drawing Sheet

RESIN-COATED METAL PLATE AND METHOD OF DRILLING PRINTED WIRING BOARD USING THE METAL PLATE

BACKGROUND OF THE INVENTION

1. Field of the Invention

The present invention relates to a resin-coated metal plate used as a protective back plate for efficiently obtaining high-quality products in drilling as one of steps of manufacturing a printed wiring board, and a method of drilling a printed wiring board using the resin-coated metal plate.

2. Description of the Related Art

The printed wiring board is for mounting electronic components and electrically connecting between the electronic components, and extremely important as an internal component of an electric product. In manufacturing the printed wiring board, as one of steps of manufacturing the board, there is a step of forming through-holes in a sectional direction in order to enable current supply between the uppermost layer and the lowermost layer of the printed wiring board. The through-holes are indispensable for the printed wiring board, and typically the number of the through-holes is large, therefore the drilling step holds an important position in manufacturing the printed wiring board.

While the printed wiring board generally includes a composite material formed by alternately stacking conductor layers including a copper foil, and insulating layers including glass woven fabric cloth in which epoxy resin or the like is impregnated and cured, physical properties are different between the material configuring the conductor layers and the material configuring the insulating layers. Therefore, there is a difficulty that defects such as boundary separation between the conductor layer and the insulating layer, or a crack tend to occur during drilling with a drill, causing deterioration in surface roughness of a inner wall of a through-hole, or wear or breakage of a drill, that is, a bad effect is induced on drilling with a drill due to the difference in physical properties. Moreover, since periodical irregularity due to irregularity of the insulating layer (glass fiber cloth) exists on a surface of the printed wiring board, positional accuracy tends to be degraded during drilling with a drill. Furthermore, there is a difficulty that resin in the printed wiring board is softened due to heat generated during drilling with a drill, and formed into a stain so-called smear which is easily adhered on the conductor layer (copper foil), leading to a factor of insufficient electrical conduction after through-hole plating.

In particular, with recent size reduction and improvement in accuracy of electronic devices, a drilled hole (through-hole) provided in the printed wiring board is advanced in reduction in diameter or increase in density, and a technique is now indispensable, the technique enabling formation of a drilled hole having a smooth-inner wall at a more accurate position. Furthermore, reduction in manufacturing cost is increasingly demanded from a recent economical situation, consequently a more efficient production technology of the printed wiring board is intensively required to be established.

To overcome the difficulty, as a technique for enabling suppression of heat generation during drilling, U.S. Pat. No. 4,781,495 and U.S. Pat. No. 4,929,370 disclose a method in which a sheet impregnated with aqueous lubricant is disposed on one side or two sides of a laminated board, then the laminated board is subjected to drilling using the sheet impregnated with aqueous lubricant as a back plate. In the sheet impregnated with aqueous lubricant used in such a drilling method, a mixture of glycol such as diethylene glycol or dipropylene glycol as a solid aqueous lubricant, synthesized wax such as fatty acid, and nonionic surfactant are impregnated in a porous material such as paper.

JP-A-2002-120198 discloses a method in which an aqueous-resin-coated metal plate, which is formed by adhering a mixture of polyethylene glycol-dimethyl terephthalate polycondensation and polyoximethylene monostearate, either of which is an aqueous compound, on one side of an aluminum plate is used as a back plate for drilling with a drill.

JP-A-2001-150215 discloses a method in which a sheet is piled on a printed wiring board for drilling, the sheet being formed by pasting a thermoplastic resin film in a multilayer structure, which is formed by laminating a thermoplastic resin layer containing no slipping agent on the outside of a thermoplastic resin layer containing a slipping agent, and a metal foil together. JP-A-2001-246696 and JP-A-2000-218599 disclose a sheet is formed by laminating a polyester resin composition, including thermoplastic polyester resin mixed with inorganic filler and/or aqueous slipping agent, and a metal foil, and a drilling method using the sheet. Furthermore, JP-B-7-50831 discloses a method of disposing a thermoplastic film having a melting temperature of 100 to 150° C. directly on a copper foil as a method of manufacturing a printed wiring board.

SUMMARY OF THE INVENTION

However, any of the above techniques has not been sufficient to measure an issue of efficiently providing a drilled hole having a smooth inner wall at a more accurate position, which is required in a process of drilling the printed wiring board with a drill.

In view of foregoing, in drilling a printed wiring board with a drill, it is desirable to provide a resin-coated metal plate used for drilling a printed wiring board, by which a drilled hole excellent in smoothness of an inner wall can be provided at an accurate position with high quality and high efficiency particularly under a high-density drilling condition in which drill entering speed is high, production volume is large, and a distance between adjacent drilled holes (pitch) is short, and breakability is reduced with respect to the drill; and a method of drilling the printed wiring board using the metal plate.

To measure the above issue, the inventors made earnest study on a resin film as a compositional material of the resin-coated metal plate, as a result, they found that when physical properties of a thermoplastic resin as the resin film were appropriately adjusted, a resin-coated metal plate that met a purpose for a back plate for drilling was obtained, and consequently completed the invention.

To measure the issue, an embodiment of the invention is configured as a resin-coated metal plate used as a protective back plate in drilling a printed wiring board, which has a metal plate, and a resin film including a thermoplastic resin coated on at least one surface of the metal plate; wherein in the thermoplastic resin, melting peak temperature measured according to JIS K 7121 is in a range of 60° C. to 120° C., and in the case that the thermoplastic resin is analyzed using a thermomechanical analyzer (TMA) according to JIS K 7196, when thickness of the resin is 100 μm, in a TMA curve measured with end diameter of an indenter of a probe being 1.0 mm, force applied to the indenter being 0.5 N, and a heating rate being 5° C./min, temperature difference is within a range of 5° C. to 30° C. in a period while penetration of the probe is changed from 10% to 100% of the resin thickness in a temperature range of 20° C. to 200° C.

According to the configuration, since the thermoplastic resin configuring the resin film of the resin-coated metal plate has predetermined melting peak temperature and TMA curve behavior, when the resin-coated metal plate is used as the protective back plate during drilling the printed wiring board, the thermoplastic resin of the resin film is changed into a melted resin having appropriate viscosity due to friction heat generated with drilling. The friction heat generated during drilling is easily absorbed by the melted resin film, in addition, the melted resin is adhered on a drill, and entrained with entering of the drill to exhibit a lubricating function, and thus prompts straight advance of the drill.

Cutting dust generated with drilling is easily discharged from a drilled hole along a groove in the drill along with the melted resin. The lubricating function and cutting-dust discharge function of the melted resin improve smoothness of an inner wall of the drilled hole, and prevent the cutting dust from being remained on the resin-coated metal plate after drilling. Since rising of the periphery of the drilled hole opened in the resin-coated metal plate due to the remained cutting dust or the like does not occur, adjacent holes can be drilled without being obstructed.

Furthermore, the functions are combined, thereby particularly, even in a drilling condition of high density and high productivity with a short distance between drilled holes (pitch), which is recently becoming more severe, a deep crack can be prevented from occurring in glass fiber, phenol resin, epoxy resin, a copper sheet, paper or the like, which is a main componental material of the printed circuit board, or vigorous crash of the material can be prevented, in addition, a drilled hole (through-hole) can be obtained, which is excellent in hole position accuracy, reduced in wear of a drill, smooth in discharge of cutting dust, and has a smooth inner wall surface.

Another embodiment of the invention is configured as a resin-coated metal plate in which thickness of the resin film is 30 µm to 300 µm. According to the configuration, various functions of the melted resin of the resin film are further improved, including a function of preventing heat generation in a drill bit during drilling, lubricating function on the drill bit, function of preventing scattering of cutting dust, and function of discharging cutting dust.

Still another embodiment of the invention is configured as a resin-coated metal plate in which thickness of the metal plate is 50 µm to 300 µm. According to the configuration, various functions of the melted resin of the resin film are further improved, including a function of preventing heat generation in a drill bit during drilling, lubricating function on the drill bit, function of preventing scattering of cutting dust, and function of discharging cutting dust.

Still another embodiment of the invention is configured as a resin-coated metal plate in which the metal plate is an aluminum plate or aluminum alloy plate. According to the configuration, since the aluminum plate or aluminum alloy plate has appropriate hardness and strength, generation of various burrs in the printed wiring board can be suppressed, and the drill is prevented from being degraded.

Still another embodiment of the invention is configured as a resin-coated metal plate in which the resin film is coated on the metal plate by one of a dry laminate method, a wet laminate method, a hot laminate method, and an extrusion laminate method. According to the configuration, the resin film can be easily and simply coated (adhered) on the metal plate while controlling thickness of the resin film.

Still another embodiment of the invention is a method of drilling a printed wiring board, wherein the resin-coated metal plate according to any one of the above embodiments is disposed on at least one surface of one or laminated, several printed wiring board/boards such that the resin film faces a drill, then the printed wiring board/boards is/are subjected to drilling via the resin film using the drill.

According to the above, the resin-coated metal plate is disposed as the protective back plate on at least one surface of the printed wiring board such that the resin film faces the drill, thereby a life of the drill can be lengthened, and breakage of the drill can be suppressed by the function of preventing heat generation, lubricating function, and function of discharging cutting dust by the resin-coated metal plate (resin film), and a drilled hole being high in smoothness of an inner wall, and excellent position accuracy is obtained, therefore a high-quality printed wiring board can be manufactured. In particular, by the resin-coated metal plate of an embodiment of the invention, an excellent drilled hole can be obtained under a drilling condition of a shorter distance between drilled holes (pitch) and higher productivity (higher entering speed of a drill) with increase in density of the printed wiring board, which tends to increase more and more in recent years.

According to the resin-coated metal plate according to an embodiment of the invention, a drilled hole having excellent smoothness of an inner wall can be provided with high quality and high efficiency at an accurate position in a printed wiring board particularly in high-density drilling with a short distance between drilled holes. Moreover, the resin-coated metal plate is low in breakability with respect to a drill. Furthermore, the resin-coated metal plate is not sticky even under a hot and humid environment, therefore it is excellent in workability and preservation stability. Consequently, the resin-coated metal plate according to an embodiment of the invention exhibits excellent performance as the protective back plate during drilling the printed wiring board.

According to the method of drilling the printed wiring board according to an embodiment of the invention, the resin-coated metal plate is used as the protective back plate in at least a drill entering side, thereby a printed wiring board can be manufactured, which has excellent hole position accuracy and excellent hole-inner-wall roughness, and has low breakability with respect to a drill.

DESCRIPTION OF THE PREFERRED EMBODIMENT

Figure 1:
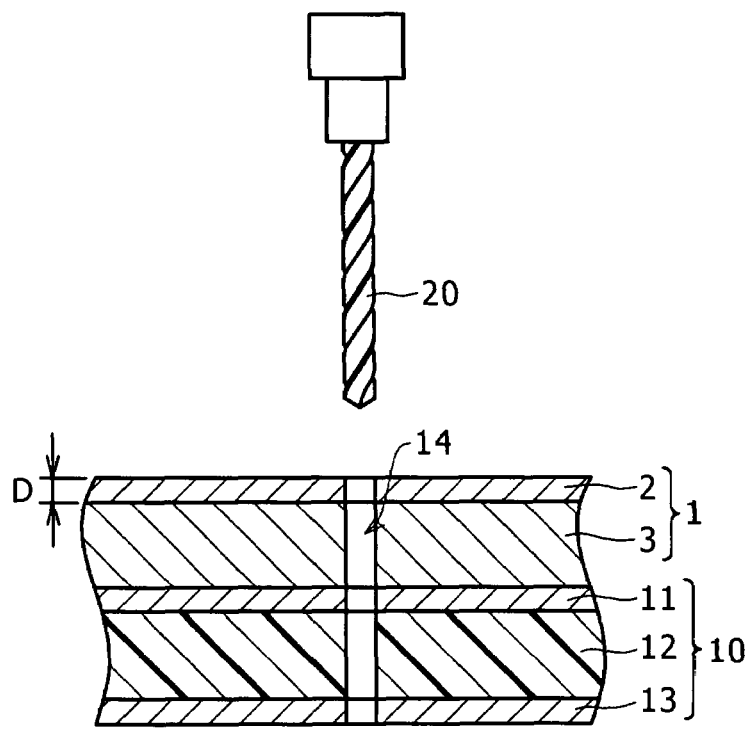
FIG. 1 is a section diagram showing an outline of a method of drilling a printed wiring board according to an embodiment of the invention.

An embodiment of a resin-coated metal plate according to the invention is described.

The resin-coated metal plate according to an embodiment of the invention is used as a protective back plate in drilling a printed wiring board, and includes a metal plate and a resin film for coating the metal plate. Hereinafter, each configuration is described.

Metal Plate

A metal plate configuring the resin-coated metal plate is not particularly limited if it can be used as the protective back plate in drilling the printed wiring board. However, preferable material or thickness is given for the metal plate, which is described later.

Resin Film

A resin film configuring the resin-coated metal plate is coated on at least one side of the metal plate. The resin film includes a thermoplastic resin. As the thermoplastic resin, a resin is selected, which has a predetermined melting peak temperature at which the resin melts by friction heat generated with drilling, in addition, has predetermined TMA curve behavior.

Melting Peak Temperature

As a standard of melting peak temperature, it is necessary to meet "melting peak temperature measured according to JIS K7121 is 60° C. to 120° C.". The reason for this is as follows. When the melting peak temperature is less than 60° C., part or all of thermoplastic resin of the resin film is melted or softened during keeping or transport particularly in summer or in a tropical area, consequently a difficulty of adhesion of resin-coated metal plates to each other may occur. Conversely, when it is more than 120° C., since the thermoplastic resin hardly melts by friction heat generated during drilling, or even if it melts, the absolute amount of melted resin is decreased, the lubricating function or cutting-dust discharge function of the melted resin cannot be expected during drilling with a drill. More preferably, a lower limit of melting peak temperature for exhibiting these functions and effects is 65° C., and further more preferably it is 70° C. On the other hand, more preferably, an upper limit of the temperature is 110° C., and furthermore preferably it is 100° C.

TMA Curve Behavior

As a standard of TMA curve behavior, it is necessary to meet "in the case that a resin is analyzed using a thermomechanical analyzer (TMA) according to JIS K 7196, when thickness of the resin is 100 μm, in a TMA curve measured with end diameter of an indenter of a probe being 1.0 mm, force applied to the indenter being 0.5 N, and a heating rate being 5° C./min, temperature difference is within a range of 5° C. to 30° C. in a period while penetration of the probe is changed from 10% to 100% of the resin thickness in a temperature range of 20° C. to 200° C.".

The reason why "temperature difference is 5° C. to 30° C. in a period while penetration of the probe is changed from 10% to 100% of resin thickness" is determined in the specification of the TMA curve is because when the TMA curve is deviated from the relevant range, particularly in a drilling condition of high density with a short distance between adjacent holes, and high productivity, an inner wall of a drilled hole tends to be roughened, or cutting dust tends to be remained on a surface of a resin-coated metal plate (protective back plate) after drilling, thereby hole position accuracy is reduced, in addition, drill breakability is degraded.

The reason for this is that when temperature difference is more than 30° C. in a period while penetration of the probe is changed from 10% to 100% of resin thickness, since the thermoplastic resin is hard to melt momentarily, the melted resin hardly penetrates following a drill, or the absolute amount of melted resin penetrating following the drill is reduced, therefore lubricity becomes insufficient. In addition, since discharge of cutting dust is degraded, the inner wall of the drilled hole tends to be damaged, consequently inner-wall roughness or hole position accuracy tends to be degraded, and the drill tend to be broken.

Conversely, when temperature difference is less than 5° C. in a period while penetration of the probe is changed from 10% to 100% of resin thickness, the thermoplastic resin excessively melts by friction heat in a drill caused by drilling, therefore when the drill is drawn out from a drilled hole and moved into a next hole to be drilled, melted resin adhered on the drill or melted resin adhered with cutting powder or the like tends to drop on a surface of the resin-coated metal plate (protective back plate). When the melted resin or the melted resin adhered with cutting powder drops on the surface of the resin-coated metal plate (protective back plate), a condition is caused: a foreign substance adheres on the surface of the resin-coated metal plate (protective back plate), and when such a portion is drilled, the hole position accuracy is extremely degraded or the drill may be broken. Such a situation can be fatal particularly in high-density drilling in which a distance between adjacent holes is short. More preferably, a lower limit of the temperature difference to exhibit the functions and effects is 7° C., and further more preferably it is 9° C. On the other hand, more preferably, an upper limit of the temperature difference is 25° C., and further more preferably it is 20° C.

The thermoplastic resin configuring the resin film in an embodiment of the invention is not particularly limited in chemical structure or kind, as long as it satisfies the standards of the melting peak temperature and the TMA curve behavior. However, preferably, amide series elastomer, butadiene series elastomer, ester series elastomer, olefin series elastomer, urethane series elastomer, styrene series elastomer, polybutene, low-density polyethylene, chlorinated polyethylene, metallocene catalyst series polyolefin resin, polyamide resin, polyester resin, ethylene-acrylic ester-maleic anhydride copolymer, ethylene-glycyl methacrylate copolymer, ethylene-vinyl acetate copolymer, ethylene-methacrylic acid copolymer, ionomer resin, ethylene-acrylic ethyl copolymer, ethylene-methacrylate copolymer, ethylene-methyl metacrylate copolymer, ethylene-ethyl acrylate copolymer, ethylene-vinyl alcohol copolymer, polylactone series resin and the like can be given, and resin selected from them can be used singly or in a combined manner.

Moreover, the thermoplastic resin configuring the resin film may be a single resin or combined resins satisfying the melting peak temperature and the TMA curve behavior, which is kneaded and melted with a known lubricant, plasticizer, slipping agent or denaturant called tackfier agent. As the denaturant, for example, polyethylene glycol, polyethylene oxide, hydrocarbon wax, chlorinated paraffin, higher fatty acid, oxy fatty acid, fatty acid amide compound, ester compound of lower alcohol, multiple alcohol, or fatty acid polyglycol, metallic soap, natural wax compound, rosin or rosin glycerin ester series resin, terpene series resin, or petroleum resin can be used singly or mixedly.

That is, as the thermoplastic resin configuring the resin film, resin having a specific chemical structure need not be newly synthesized, and the commercially available resins satisfying the melting peak temperature and the TMA curve behavior, or a mixture of them can be used. As a result, physical properties (melting peak temperature and TMA curve behavior) of a resin and a mixture containing the resin are measured, thereby determination can be promptly made on whether the resin and the mixture can be used for the resin film of the resin-coated metal plate used for drilling the printed wiring board or not.

Moreover, a method of manufacturing the resin film is not particularly limited, and a known method such as an extrusion molding method using T-die, a calendar molding method, an injection molding method, and a compression molding method can be used. However, considering production efficiency, uniformity or surface flatness of an obtained resin film and the like, the extrusion molding method using T-die is preferable.

Next, a preferred embodiment of the resin-coated metal plate according to the invention is described.

In the resin-coated metal plate according to an embodiment of the invention, thickness of the resin film is preferably "30 μm to 300 μm". The reason for this is as follows. In less than 30 μm, the functions and effects of lubricity during drilling and discharge performance of cutting dust are hard to be sufficiently exhibited. Conversely, in more than 300 μm, melted resin is excessively produced from the resin film, thereby hole position accuracy may be extremely reduced or breakage of the drill may be caused. Thickness of the relevant resin film is more preferably 35 μm to 250 μm, and most preferably 40 μm to 200 μm.

In the resin-coated metal plate according to an embodiment of the invention, thickness of the metal plate is preferably "50 μm to 300 μm". The reason for this is as follows. In less than 50 μm, handling becomes bad as the protective back plate, so that hole position accuracy is reduced during drilling, and furthermore, grounding properties of the printed wiring board and the resin-coated metal plate become insufficient, so that cutting dust tends to stay between them. In more than 300 μm, productivity is restricted, resulting in bad economy. Thickness of the metal plate is more preferably 60 μm to 200 μm, and most preferably 70 μm to 150 μm.

In the resin-coated metal plate according to an embodiment of the invention, an aluminum substrate (aluminum plate or aluminum alloy plate) is preferably used as the metal plate. Specifically, a pure aluminum series, and an aluminum alloy such as 3000 series and 5000 series are given, however, the pure aluminum series is most preferable. This is because since the aluminum plates have appropriate hardness and strength, they are used as the protective back plate during drilling, thereby various burrs generated in the printed wiring board can be suppressed, and the drill is prevented from being degraded.

In the resin-coated metal plate according to an embodiment of the invention, the resin film is preferably "resin film coated on the metal plate by one of a dry laminate method, a wet laminate method, a hot laminate method, and an extrusion laminate method". The reason for this is that according to the coating methods, the thermoplastic resin can be easily and simply adhered on the metal plate while controlling thickness of the resin.

A method of manufacturing the resin-coated metal plate according to an embodiment of the invention is not particularly limited, if the method is an industrially used, known method. Specifically, a method is exemplified, in which the thermoplastic resin configuring the resin film is formed into a uniform mixture preferably having predetermined viscosity using a roll or kneader, or other kneading unit while appropriately warming or heating the resin, and then the mixture is applied (coated) on the metal plate by a roll method or curtain coat method. In addition, a method (laminate method) is exemplified, in which the thermoplastic resin is previously formed into a sheet having a desired thickness using a press, roll, T-dye extruder or the like, then the sheet is laminated on the metal plate, and heated and pressed using a press, roll or the like to be adhered (coated) onto the metal plate using adhesive or the like according to need.

In the resin-coated metal plate according to an embodiment of the invention, a mold-release resin film, including a resin composition containing fluorine series resin and silicone series resin, may be coated on a surface of the metal plate on which the resin film is not coated. The reason for this is as follows. When the resin is coated only on one side, metal may adhere to resin between a plurality of resin-coated metal plates during transporting or keeping the resin-coated metal plates, therefore preservation stability cannot be kept in some cases. However, when the mold-release resin film is previously coated, such adhesion hardly occurs, resulting in improvement in preservation stability.

A method of drilling a hole in a printed wiring board according to an embodiment of the invention is described with reference to FIG. 1. FIG. 1 is a section diagram showing an outline of the method of drilling the hole in the printed wiring board.

As shown in FIG. 1, a resin-coated metal plate 1 according to an embodiment of the invention is disposed as the protective back plate for drilling on an uppermost surface (conductor layer 11) of a printed wiring board 10 formed by laminating conductor layers 11 and 13 on two sides of an insulating layer 12', that is, disposed at an entrance side of a drill bit 20 such that a resin film 2 is a top (that is, the resin film 2 faces the drill bit 20, and a metal plate 3 is contacted to the conductor layer 11 of the printed wiring board 10. Then, a rotating drill bit 20 is contacted vertically to the resin film 2 to start drilling. Penetrating through the resin-coated metal plate 1, the drill bit 20 reaches to the printed wiring board 10 while keeping the vertical position, and then drills a hole in the board (forms a through-hole 14). When the hole (through-hole 14) is completely drilled at a predetermined position in the printed wiring board 10, the resin-coated metal plate 1 is removed from a position on the printed wiring board 10. While not shown, the resin-coated metal plate 1 may be disposed on a lowermost surface (conductor layer 13) of the printed wiring board 10, that is, may be disposed at an exit side of the drill bit 20.

EXAMPLES

Next, examples of an embodiment of the invention are described.

Examples 1 to 7

Each of resins of resin symbols A to G shown in Table 1 was fed into a uniaxial kneader/extruder and melted and kneaded therein to be in a uniform melting condition, then the resin in such a condition was extruded from a T-die mounted on a tip of the extruder, so that a film 100 μm in thickness was prepared. The film was laminated on a heated, pure aluminum plate specified by JIS) 100 μm in thickness while being fused to the aluminum plate, so that a resin-coated metal plate for drilling a printed wiring board was prepared.

Manufacturer names and trade names (grade) of used resins, lubricants, paraffin wax, and surfactants are as follows.
Ethylene-Ethylacrylate Copolymer Resin (1)
EVAFLEX (registered trademark)-EEA, Grade: A-701, manufactured by DU PONT-MITSUI POLYCHEMICALS CO., LTD.
Ethylene-Ethylacrylate Copolymer Resin (2)
EVAFLEX-EEA, Grade: A-704, manufactured by DU PONT-MITSUI POLYCHEMICALS CO., LTD.
Ethylene-Ethylacrylate Copolymer Resin (3)
EVAFLEX-EEA, Grade: A-715, manufactured by DU PONT-MITSUI POLYCHEMICALS CO., LTD.
Lubricant (1)
CANAX FK-436, manufactured by CHUKYO YUSHI. CO., LTD
Ethylene-Vinyl Acetate Copolymer Resin (1)
EVAFLEk, Grade: EV150, manufactured by DU PONT-MITSUI POLYCHEMICALS CO., LTD.
Low-Density Polyethylene
Grade: NUCG-5472, manufactured by Nippon Unicar Company Limited
Paraffin Wax (1)
Grade: OX-3015, manufactured by Nippon Seiro Co., Ltd.
Polycaprolactone Series Resin
CELGREEN (registered trademark), Grade: PH7, manufactured by DAICEL CHEMICAL INDUSTRIES LTD.

Surfactant

NEWPOL (registered trademark) PE, Grade: NEWPOL PE-128, manufactured by Sanyo Chemical Industries, Ltd.

Melting peak temperature and TMA curve behavior of used resins (resin symbols A to G) were measured by the following methods. Results are shown in Table 1.

(1) Melting Peak Temperature

Melting peak temperature of resin was measured according to JIS K 7121 (Testing Methods for Transition Temperatures of Plastics). That is, according to the "Testing Methods for Transition Temperatures of Plastics", a resin film strip of about 20 mg, which was enclosed in an aluminum sample pan, was measured with being heated at a rate of 10° C./min from 0° C. to 250° C. under a nitrogen atmosphere using a differential scanning calorimeter (DSC, DSC7 manufactured by PerkinElmer, Inc). In an obtained calorimetric curve, a portion from a point where a curve is separated from a baseline to a point where the curve is returned to the baseline again was assumed as melting peak, and temperature at the top of the melting peak was assumed as the melting peak temperature.

(2) TMA Curve Behavior

A TMA curve of a resin was measured according to JIS K 7196 (Testing method for softening temperature of thermoplastics film and sheeting by thermomechanical analysis)

Figure 2:
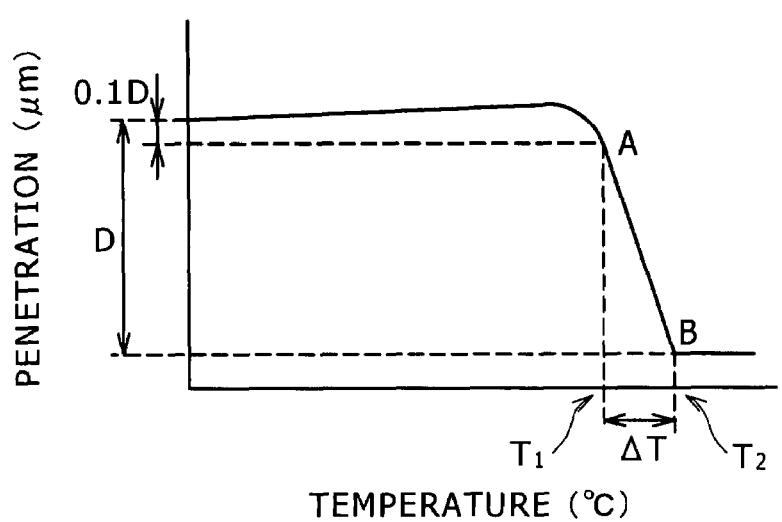
FIG. 2 is a graph showing an example of a TMA curve.

That is, according to the "Testing method for softening temperature of thermoplastics film and sheeting by thermomechanical analysis", a sample film 100 μm in thickness was formed into a test piece having a size of 5 mm square, and the test piece was subjected to measurement with being heated at a rate of 5° C./min from 20° C. to 200° C. under a nitrogen atmosphere at a condition that end diameter of an indenter of a probe was 1.0 mm, and force applied to the indenter was 0.5 N using a thermomechanical analyzer (TMA, TMA7 manufactured by PerkinElmer, Inc). In an obtained TMA curve, temperature difference in a period while penetration of the probe was changed from 10% to 100% of film thickness (resin thickness) was calculated. That is, as shown in FIG. 2, calculation was made on temperature difference ΔT between temperature $T_1$ at a point A where penetration was 10% of film thickness D and temperature $T_2$ at a point B where penetration was 100% of film thickness D. Here, FIG. 2 is a graph showing an example of the TMA curve.

Comparative Examples 1 to 4

Resin-coated metal plates for drilling the printed wiring board were prepared in the same way as in the example except for using resins H to K'shown in Table 1. Table 3 shows used resins, used film thickness, and used thickness of pure aluminum plates.

Manufacturer names and trade names (grade) of used resins, slipping agents, lubricants, and paraffin wax are as follows.

Modified Polyethylene

MODIC (registered trademark)-AP, Grade: M132C, manufactured by Mitsubishi Chemical Corporation Modified Polypropylene Series Resin Adflex, Grade: Z104S, manufactured by SunAllomer Ltd.

Slipping Agent

Erucamide, ALFFLOW (registered trademark) P-10, manufactured by NOF CORPORATION

Paraffin Wax (2)

Grade: OX-3215, manufactured by Nippon Seiro Co., Ltd.

Ethylene-Vinyl Acetate Copolymer Resin (2)

NOVATEC (registered trademark) EVA, Grade: LV780, manufactured by Japan Polychem Corporation Polyethylene Glycol Series Resin Grade: PAOGEN (registered trademark) PP-15, manufactured by DAI-ICHI KOGYO SEIYAKU CO., LTD.

Lubricant (2)

Petrolatum oxide metallic salt, Grade: OX-0851, manufactured by Nippon Seiro Co., Ltd.

Melting peak temperature and TMA curve behavior of used resins (resin symbols H to K) were measured by the same methods as in the example 1. Results are shown in Table 1.

Examples 8 to 13

Using a resin of resin symbol A shown in Table 1, resin-coated metal plates for drilling the printed wiring board were prepared in the same way as in the example 1 except for setting film thickness to be 30, 40, 150, 200, 250 and 300 μm. Table 2 shows used film thickness and thickness of pure aluminum plates.

Examples 14 to 19

Using the resin of resin symbol A shown in Table 1, resin-coated metal plates for drilling the printed wiring board were prepared in the same way as in the example 1 except for setting thickness of pure aluminum plates to be 50, 70, 150, 200, 250 and 300 μm. Table 2 shows used film thickness and thickness of pure aluminum plates.

Examples 20 to 23

Using the resin of resin symbol A shown in Table 1, resin-coated metal plates for drilling the printed wiring board were prepared in the same way as in the example 1 except for setting film thickness to be 25, 100, and 350 μm, and setting thickness of pure aluminum plates to be 40, 100 and 350 μm. Table 4 shows used film thickness and thickness of pure aluminum plates.

Next, the resin-coated metal plates prepared in the examples 1 to 23 and comparative examples 1 to 4 were subjected to drilling, and drilling performance (hole position accuracy, hole-inner-wall roughness, and drill breakability) was evaluated by the following method. Results are shown in Table 2 for the examples 1 to 19, Table 3 for the comparative examples 1 to 4, and Table 4 for the examples 20 to 23.

In the drilling method, the resin-coated metal plate was placed at a side where a resin-coated surface was contacted to a drill, and four layers of double-sided copper-foil clad printed wiring boards (copper foil thickness of a conductor layer: 18 μm) were placed in four layers under the metal plate, the wiring boards being made of FR-4 and 0.8 mm in thickness respectively, and furthermore, a backup board including a Bakelite plate 1.5 mm in thickness was disposed under the wiring boards, and then the printed wiring boards were subjected to drilling.

The drilling was performed according to the following condition.

Drilling Condition

Drill bit: diameter of 0.25 mm

Rotation speed: 200,000 rpm

Infeed rate: 3.0 m/min

Retraction rate: 25.4 m/min

Distance between centers of adjacent drilled holes: 0.4 mm

The number of drill hits: 5000 hits

Hole Position Accuracy

Evaluation of hole position accuracy was carried out on a backside of the lowermost (fourth) board after 5000 hits (drilling) of drill bits were formed. That is, an error interval from the center of a hole was measured for each of the hit, 5000 drilled-holes in the back of the lowermost board, then, a maximum value of them was calculated. The hole position accuracy was evaluated as "⊚" for the maximum value of less than 50 μm, "○" for the maximum value of 50 μm or more and less than 60 μm, "Δ" for the maximum value of 60 μm or more and less than 75 μm, and "X" for the maximum value of 75 μm or more.

Hole-Inner-Wall Roughness

Evaluation of hole-inner-wall roughness was carried out on the uppermost board, and inner-wall roughness was measured at right and left of a section of each of 50 through-holes from first to fiftieth hits. Then, the inner-wall roughness was evaluated as "⊚" for the maximum value of less than 10.0 μm, "○" for the maximum value of 10.0 μm or more and less than 12.5 μm, "Δ" for the maximum value of 12.5 μm or more and less than 15.0 μm, and "X" for the maximum value of 15.0 μm or more.

Drill Breakability

Evaluation of drill breakability was carried out on presence of drill breakage during drilling at the above condition. The drill breakability was evaluated as "⊚" for a sample in which a drill was not broken at 5000 hits or less, "○" for a sample in which a drill was broken at 4000 hits or more and less than 5000 hits, "Δ" for a sample in which a drill was broken at 3000 hits or more and less than 4000 hits, and "X" for a sample in which a drill was broken at less than 3000 hits.

TABLE 1

| Resin symbol | Resin composition | Melting peak temperature (° C.) | TMA curve behavior Temperature difference (° C.) |
|---|---|---|---|
| A | Ethylene-ethylacrylate copolymer resin (1) 10 weight percent + Ethylene-ethylacrylate copolymer resin (2) 20 weight percent + Ethylene-ethylacrylate copolymer resin (3) 30 weight percent + Lubricant (1) 40 weight percent | 72 | 9.2 |
| B | Ethylene-ethylacrylate copolymer resin (1) 20 weight percent + Ethylene-ethylacrylate copolymer resin (2) 20 weight percent + Ethylene-ethylacrylate copolymer resin (3) 25 weight percent + Lubricant (1) 35 weight percent | 79 | 14.6 |
| C | Ethylene-ethylacrylate copolymer resin (1) 40 weight percent + Ethylene-ethylacrylate copolymer resin (2) 25 weight percent + Ethylene-ethylacrylate copolymer resin (3) 15 weight percent + Lubricant (1) 20 weight percent | 83 | 18.3 |
| D | Ethylene-vinyl acetate copolymer resin (1) 100 weight percent | 62 | 28.4 |
| E | Low-density polyethylene 40 weight percent + Paraffin wax (1) 60 weight percent | 117 | 6.8 |
| F | Low-density polyethylene 85 weight percent + Paraffin wax (1) 15 weight percent | 119 | 29.5 |
| G | Polycaprolactone series resin 55 weight percent + Surfactant 45 weight percent | 61 | 5.5 |
| H | Modified polyethylene 100 weight percent | 122 | 33.6 |
| I | Modified polypropylene series resin 40 weight percent + Slipping agent 5 weight percent + paraffin wax (2) 55 weight percent | 124 | 4.3 |
| J | Ethylene-vinyl acetate copolymer resin (2) 100 weight percent | 58 | 30.8 |
| K | Polyethylene glycol series resin 65 weight percent + Lubricant (2) 35 weight percent | 52 | 3.2 |

TABLE 2

| Example | Resin symbol | Film thickness (μm) | Thickness of pure aluminum plate (μm) | Hole position accuracy | Hole-inner-wall roughness | Drill breakability |
|---|---|---|---|---|---|---|
| 1 | A | 100 | 100 | ⊚ | ⊚ | ⊚ |
| 2 | B | 100 | 100 | ⊚ | ⊚ | ⊚ |
| 3 | C | 100 | 100 | ⊚ | ⊚ | ⊚ |
| 4 | D | 100 | 100 | ⊚ | ○ | ⊚ |
| 5 | E | 100 | 100 | ⊚ | ○ | ⊚ |
| 6 | F | 100 | 100 | ⊚ | ○ | ⊚ |
| 7 | G | 100 | 100 | ○ | Δ | ⊚ |
| 8 | A | 30 | 100 | ○ | Δ | ○ |
| 9 | A | 40 | 100 | ⊚ | ⊚ | ⊚ |
| 10 | A | 150 | 100 | ⊚ | ⊚ | ⊚ |
| 11 | A | 200 | 100 | ⊚ | ⊚ | ⊚ |
| 12 | A | 250 | 100 | Δ | ⊚ | ○ |
| 13 | A | 300 | 100 | Δ | ⊚ | ○ |
| 14 | A | 100 | 50 | Δ | ○ | ○ |
| 15 | A | 100 | 70 | ⊚ | ⊚ | ⊚ |
| 16 | A | 100 | 150 | ⊚ | ⊚ | ⊚ |

TABLE 2-continued

| Example | Resin symbol | Film thickness (μm) | Thickness of pure aluminum plate (μm) | Drilling performance | | |
|---|---|---|---|---|---|---|
| | | | | Hole position accuracy | Hole-inner-wall roughness | Drill breakability |
| 17 | A | 100 | 200 | ◎ | ◎ | ◎ |
| 18 | A | 100 | 250 | ○ | ○ | ○ |
| 19 | A | 100 | 300 | ○ | ○ | ○ |

TABLE 3

| Comparative example | Resin symbol | Film thickness (μm) | Thickness of pure aluminum plate (μm) | Drilling performance | | |
|---|---|---|---|---|---|---|
| | | | | Hole position accuracy | Hole-inner-wall roughness | Drill breakability |
| 1 | H | 100 | 100 | Δ | X | Δ |
| 2 | I | 100 | 100 | X | Δ | Δ |
| 3 | J | 100 | 100 | Δ | X | Δ |
| 4 | K | 100 | 100 | X | ○ | Δ |

TABLE 4

| Example | Resin symbol | Film thickness (μm) | Thickness of pure aluminum plate (μm) | Drilling performance | | |
|---|---|---|---|---|---|---|
| | | | | Hole position accuracy | Hole-inner-wall roughness | Drill breakability |
| 20 | A | 25 | 100 | ○ | Δ | ○ |
| 21 | A | 350 | 100 | Δ | ○ | ○ |
| 22 | A | 100 | 40 | Δ | ○ | ○ |
| 23 | A | 100 | 350 | ○ | ○ | ○ |

As shown in Tables 1 and 2, in the examples 1 to 19 of an embodiment of the invention, it was confirmed that any of hole position accuracy during drilling with a drill, inner wall roughness of a through-hole (drilled hole), and drill breakability during drilling was good.

In the examples 1 to 7, a kind of the thermoplastic resin of the resin film is changed. Among them, in the examples 1, 2 and 3, since the melting peak temperature and the TMA curve behavior of the thermoplastic resin were included in a preferable range in any of the samples, excellent drilling performance was obtained even at a high-density drilling condition with a short distance between adjacent holes. In the example 4, the melting peak temperature was near the lower limit, and the TMA curve behavior was near the upper limit. On the other hand, conversely in the example 5, the melting peak temperature was near the upper limit, and the TMA curve behavior was near the lower limit. Therefore, in the examples 4 and 5, it was confirmed that while unproblematic performance was obtained in hole position accuracy and drill breakability, the performance tended to be slightly degraded in hole-inner-wall roughness. That is, unless values of the melting peak temperature and the TMA curve behavior were within a preferable range respectively, melting behavior of the resin became somewhat worse, resulting in slight degradation in performance, particularly in hole-inner-wall roughness having the largest effect on lubricating performance during drilling. In the example 6 or 7, both values of the melting peak temperature and the TMA curve behavior are near the upper limit or the lower limit respectively. In the case of the example 6 in which both values are near the upper limit, it was confirmed that since melting behavior of resin tended to be worse due to heat generation in a drill, the performance was somewhat degraded in the hole-inner-wall roughness. On the other hand, conversely in the example 7, it was confirmed that while the performance was unproblematic in the hole-inner-wall roughness because the resin had an excellent property in melting behavior, cutting powder generated during drilling tended to be slightly remained on a surface of the resin-coated metal plate (protective back plate), consequently hole position accuracy was slightly reduced.

In the examples 8 to 13, film (resin film) thickness is changed. It was confirmed that while drilling performance was not bad in any of the examples, the performance was good in the case of film (resin film) thickness of 30 μm to 300 μm, and excellent in the case of 40 μm to 200 μm.

In the examples 14 to 20, thickness of the pure aluminum plate is changed. It was confirmed that while drilling performance was not bad in any of the examples, the performance was good in the case of thickness of the pure aluminum plate of 50 μm to 300 μm, and excellent in the case of 70 μm to 150 μm.

On the other hand, as shown in Tables 1 and 3, any of the comparative examples 1 to 4, which did not satisfy a scope of an embodiment of the invention, was not wholly good in a series of drilling performance items.

In the comparative examples 1 to 4, a kind of the thermoplastic resin of the resin film is changed. Among them, in the comparative example 1, the following result was given: since both values of the melting peak temperature and the TMA curve behavior were more than the upper limit value, melting behavior of the resin was bad, and particularly the hole-inner-wall roughness was adversely affected thereby. In the comparative example 2, the following result was given: since the melting peak temperature was more than the upper limit value, and the TMA curve behavior was less than the lower limit value, cutting power generated during drilling tended to be remained on the surface of the resin-coated metal plate (protective back plate), and performance in hole position accuracy was adversely affected thereby. In the comparative example 3, the following result was given: since the melting peak temperature was less than the lower limit value, and the TMA curve behavior was more than the upper limit value, melting behavior of the resin was bad, and particularly the hole-inner-wall roughness was adversely affected thereby. In the comparative example 4, the following result was given: since both values of the melting peak temperature and the TMA curve behavior were less than the lower limit value, cutting powder generated during drilling tended to be remained on the surface of the protective back plate, and performance in the hole position accuracy was adversely affected thereby.

On the other hand, in the examples 20 to 23, a kind of the thermoplastic resin of the resin film is the same as that in the example 1, and film (resin film) thickness or thickness of the pure aluminum plate is changed. Among them, in the examples 20 and 21, film (resin film) thickness is changed. Both of them had good drill breakability, and sufficiently fitted for practice as the protective back plate used for drilling. However, in the example 20, since film (resin film) thickness was less than the lower limit value, lubricating performance was slightly insufficient, consequently degradation in hole-inner-wall roughness was somewhat observed. In the example 21, since film (resin film) thickness was more than the upper limit value, straight advance ability was slightly degraded, consequently reduction in hole position accuracy was somewhat observed.

In the examples 22 and 23, thickness of the pure aluminum plate is changed. Both of them had good drill breakability. However, in the example 22, since thickness of the pure aluminum plate was less than the lower limit value, cutting dust was easy to enter into a space between the resin-coated metal plate and the printed wiring board, consequently the hole position accuracy was slightly reduced. On the other hand, in the example 23, while all properties to be exhibited by an embodiment of the invention are provided, since thickness of the pure aluminum plate is more than the upper limit value, there is a problem that the required amount of aluminum to be necessary per unit area is increased, leading to increase in cost. However, they also sufficiently fit for practice as the protective back plate used for drilling.

While the resin-coated metal plate according to an embodiment of the invention, and the method of drilling the printed wiring board using the metal plate were described in the above description, the invention is not limited to the description of the embodiment and the examples, and can be altered or modified within a scope without departing from claims.

What is claimed is:

1. A resin-coated metal plate used as a protective plate in drilling a printed wiring board, comprising:
   a metal plate, and
   a resin film including a thermoplastic resin coated on at least one surface of the metal plate;
   wherein a melting peak temperature of the thermoplastic resin measured according to JIS K 7121 is in a range of 60° C. to 120° C., and
   the thermoplastic resin is analyzed using a thermomechanical analyzer (TMA) according to JIS K 7196, when a thickness of the resin is 100 μm, in a TMA curve measured with an end diameter of an indenter of a probe being 1.0 mm, a force applied to the indenter being 0.5 N, and a heating rate being 5° C./min, a temperature difference exhibited by the thermoplastic resin is within a range of 5° C. to 30° C. in a period while penetration of the probe is changed from 10% to 100% of the resin thickness in a temperature range of 20° C. to 200° C.

2. The resin-coated metal plate according to claim 1, wherein thickness of the resin film is 30 μm to 300 μm.

3. The resin-coated metal plate according to claim 1, wherein thickness of the metal plate is 50 μm to 300 μm.

4. The resin-coated metal plate according to claim 1, wherein the metal plate is an aluminum plate or aluminum alloy plate.

5. The resin-coated metal plate according to claim 1, wherein the resin film is coated on the metal plate by one of a dry laminate method, a wet laminate method, a hot laminate method, and an extrusion laminate method.

6. The resin-coated metal plate according to claim 1, wherein the thermoplastic resin is analyzed using the TMA according to JIS K 7196, when the thickness of the resin is 100 μm, in a TMA curve measured with the indenter, the force applied to the indenter, and the heating rate, a temperature difference exhibited by the thermoplastic resin is within a range of 7° C. to 25° C. in the period while penetration of the probe is changed from 10% to 100% of the resin thickness in the temperature range of 20° C. to 200° C.

7. The resin-coated metal plate according to claim 1, wherein the thermoplastic resin is analyzed using the TMA according to JIS K 7196, when the thickness of the resin is 100 μm, in a TMA curve measured with the indenter, the force applied to the indenter, and the heating rate, a temperature difference exhibited by the thermoplastic resin is within a range of 9° C. to 20° C. in the period while penetration of the probe is changed from 10% to 100% of the resin thickness in the temperature range of 20° C. to 200° C.

* * * * *